(12) United States Patent
Ankamreddi et al.

(10) Patent No.: US 10,498,333 B1
(45) Date of Patent: Dec. 3, 2019

(54) ADAPTIVE GATE BUFFER FOR A POWER STAGE

(71) Applicant: TEXAS INSTRUMENTS INCORPORATED, Dallas, TX (US)

(72) Inventors: Ramakrishna Ankamreddi, Bengaluru (IN); Rohit Phogat, Bengaluru (IN); Ranjit Kumar Dash, Bengaluru (IN); Saurabh Rai, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/261,863

(22) Filed: Jan. 30, 2019

Related U.S. Application Data

(60) Provisional application No. 62/785,942, filed on Dec. 28, 2018.

(30) Foreign Application Priority Data

Oct. 24, 2018 (IN) .............................. 201841040076

(51) Int. Cl.
*G11C 7/10* (2006.01)
*H03K 17/16* (2006.01)
(Continued)

(52) U.S. Cl.
CPC ......... *H03K 17/6872* (2013.01); *G05F 1/565* (2013.01); *G05F 1/575* (2013.01)

(58) Field of Classification Search
CPC .... H03K 17/16; H03K 17/6872; G05F 1/565; G05F 1/575; G01R 27/26; G01R 27/2605

USPC ........ 327/108, 111, 170, 404, 538; 323/222, 323/242, 280, 315, 316, 312; 324/678, 324/679, 681, 686, 688

See application file for complete search history.

(56) References Cited

U.S. PATENT DOCUMENTS

| | | | | |
|---|---|---|---|---|
| 5,801,564 A | * | 9/1998 | Gasparik | ............... H03F 3/3028 327/112 |
| 7,586,331 B2 | * | 9/2009 | La Placa | ............... H03K 17/167 326/26 |

(Continued)

OTHER PUBLICATIONS

Brata, R. et al. "Integrated Current Sensor for Automotive Power Switches." PROC. 3oth International Conference on Microelectronics (MIEL 2017), NIS, Serbia, Oct. 9-11, 2017, pp. 113-116.

*Primary Examiner* — Rajnikant B Patel
(74) *Attorney, Agent, or Firm* — Tuenlap Chan; Charles A. Brill; Frank D. Cimino

(57) ABSTRACT

A circuit includes a first power transistor including a first control input and first and second current terminals. The circuit includes a second power transistor including a second control input and third and fourth current terminals. Third current terminal couples to the first current terminal, and the fourth current terminal couples to the second current terminal at an output node. An error amplifier generates an error signal based on a difference between a reference voltage and an output voltage on the output node. An adaptive buffer couples to an output of the error amplifier and couples to the first and second control inputs. The adaptive buffer causes the first power transistor to be on through a range of output current and to cause the second power transistor to be on through some, but not all, of the range of output current.

20 Claims, 7 Drawing Sheets

(51) Int. Cl.
  *G05F 1/565* (2006.01)
  *H03K 17/687* (2006.01)
  *G05F 1/575* (2006.01)

(56) References Cited

U.S. PATENT DOCUMENTS

| | | | |
|---|---|---|---|
| 7,868,643 B2 | 1/2011 | Kadow et al. | |
| 8,461,880 B2 * | 6/2013 | Tran | H03K 19/00361 |
| | | | 327/108 |
| 8,760,133 B2 * | 6/2014 | Hasegawa | G05F 1/575 |
| | | | 323/273 |
| 2008/0191670 A1 | 8/2008 | Oddoart et al. | |
| 2010/0289475 A1 * | 11/2010 | Lipka | G05F 1/575 |
| | | | 323/315 |

\* cited by examiner

ADAPTIVE GATE BUFFER FOR A POWER STAGE

CROSS-REFERENCE TO RELATED APPLICATIONS

This application claims priority to India Provisional Patent App. No. 201841040076 filed Oct. 24, 2018 and U.S. Provisional Patent App. No. 62/785,942 filed Dec. 28, 2018, which are incorporated herein by reference.

BACKGROUND

A voltage regulator receives an input voltage and generates an output voltage at a target voltage level. The input voltage may not be regulated, but the output voltage is regulated within the design specifications of the regulator. One type of voltage regulator is a low dropout (LDO) regulator. An LDO regulator generally includes a "pass" device such as metal oxide semiconductor field effect transistor (MOSFET), also sometimes referred to as a PassFET. Current from an input voltage node flows through the PassFET to the load. The output voltage to the load (or a voltage derived from the output voltage) is provided to an input of an error amplifier. The other error amplifier input receives a reference voltage. The error amplifier generates an error signal based on the difference between its two input voltages and the error signal is used to control the gate of the PassFET to thereby regulate current flow through the PassFET to the load.

SUMMARY

A circuit includes a first power transistor including a first control input and first and second current terminals. The circuit includes a second power transistor including a second control input and third and fourth current terminals. Third current terminal couples to the first current terminal, and the fourth current terminal couples to the second current terminal at an output node. An error amplifier generates an error signal based on a difference between a reference voltage and an output voltage on the output node. An adaptive buffer couples to an output of the error amplifier and couples to the first and second control inputs. The adaptive buffer causes the first power transistor to be on through a range of output current and to cause the second power transistor to be on through some, but not all, of the range of output current.

BRIEF DESCRIPTION OF THE DRAWINGS

For a detailed description of various examples, reference will now be made to the accompanying drawings in which.

DETAILED DESCRIPTION

Figure 1:
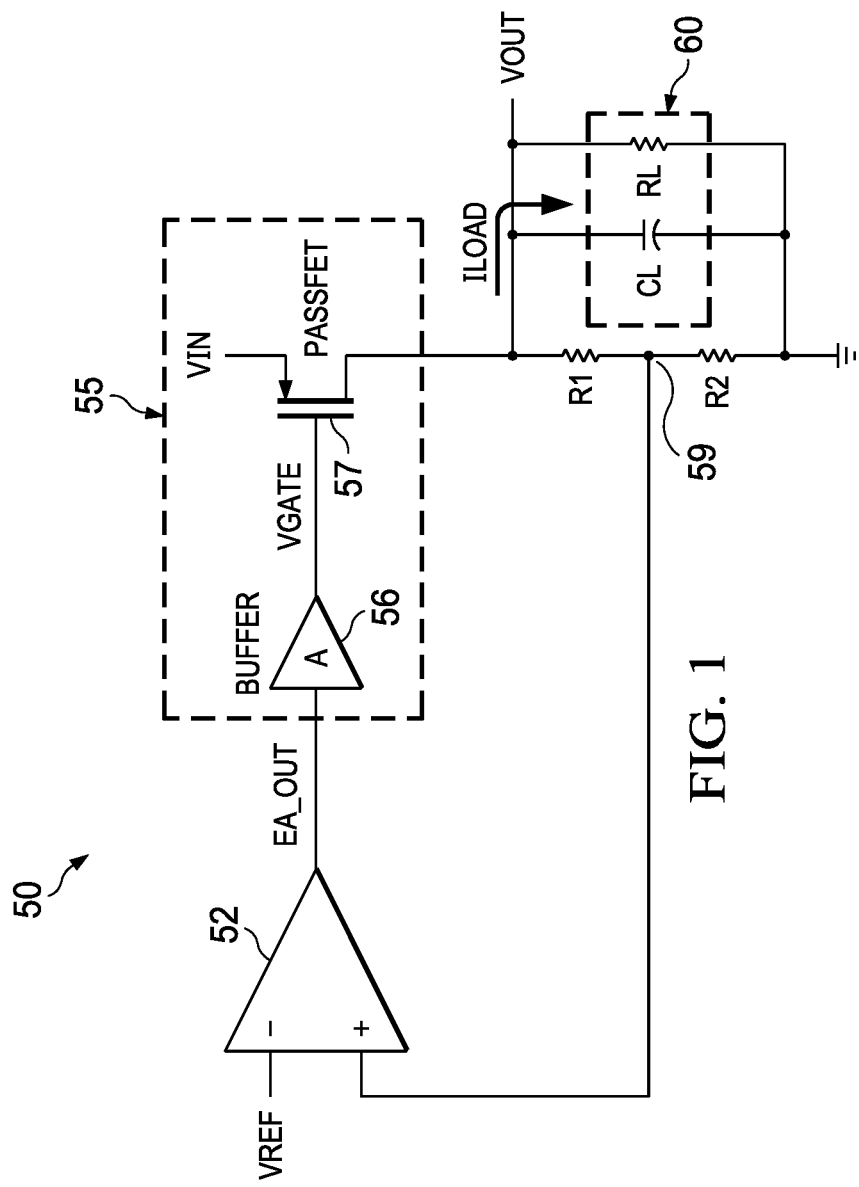
FIG. 1 illustrates a schematic of an LDO regulator.

FIG. 1 shows a schematic of an LDO regulator 50 including an error amplifier 52, a power stage 55, and a voltage divider including resistors R1 and R2. The LDO regulator 50 in FIG. 1 is shown coupled to a load 60. The power stage 55 provides an output voltage (VOUT) for the load 60. The load 60 can be any type of load that operates from a regulated supply voltage. The load 60 can be modeled as a load resistance (RLOAD) and a load capacitance (CLOAD) as shown. R1 and R2 are connected in series between VOUT and ground to generate a scaled version of VOUT on node 59. The scaled version of VOUT is provided as a feedback voltage (Vfb) to the positive input of the error amplifier 52, or in other implementations to the error amplifier's negative input. Other implementations may omit the resistor divider and provide the VOUT directly to the input of the error amplifier 52. All references herein to the error amplifier 52 receiving Vfb on one of its inputs refers to either of VOUT being provided directly to the error amplifier or a scaled version of VOUT (via a voltage divider) being provided to the error amplifier.

The negative input of the error amplifier 52 in the example of FIG. 1 receives a reference voltage (VREF). The error amplifier 52 generates an output signal (EA_OUT) that is provided to the power stage 55. The error amplifier output signal EA_OUT is generated based on the difference between VREF and Vfb. With Vfb provided to the positive input of the error amplifier 52, EA_OUT is directly proportional to Vfb (and thus VOUT). That is, as VOUT decreases, EA_OUT decreases as well, and vice versa. As such, as the load current (ILOAD) to the load 60 increases, VOUT will tend to decrease, and as VOUT decreases, EA_OUT decreases as well. EA_OUT is received by buffer 56 which generates a gate voltage (VGATE) to the PassFET 57. The PassFET 57 in this example comprises a p-type FET device, whose source is connected to the input voltage node (VIN) and whose drain is coupled to the load 60 to provide VOUT. As the load current increases, VOUT will tend to decrease which causes the error amplifier 52 to generate a lower EA_OUT voltage. As a result, VGATE decreases as well, which increases the gate-to-source voltage (VGS) of the p-type PassFET 57. The PassFET 57 responds by providing an increased load current to the load 60, which thereby increases VOUT. In this manner, the LDO regulator 50 provides a regulated VOUT to the load 60.

Figure 2:
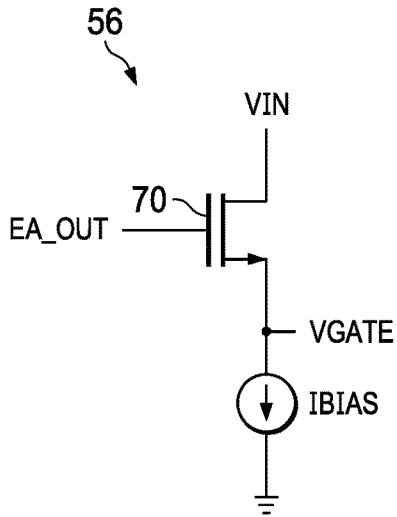
FIG. 2 illustrates a schematic of a buffer to drive the gate of the PassFET of the LDO regulator of FIG. 1.
Figure 3:
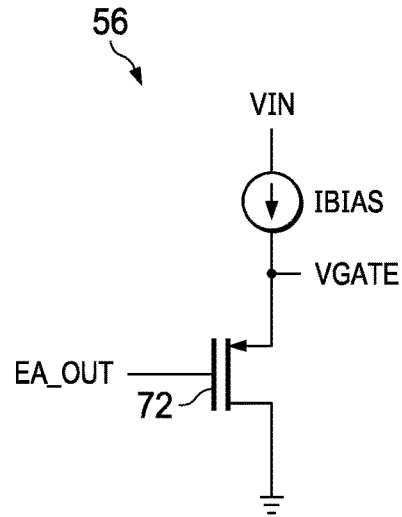
FIG. 3 illustrates a schematic of another buffer to drive the gate of the PassFET of the LDO regulator of FIG. 1.

FIGS. 2 and 3 illustrate different types of buffers 56. In FIG. 2, buffer 56 comprises an n-type MOSFET device 70 and a bias current source (IBIAS). EA_OUT controls the gate of n-type MOSFET device 70. As EA_OUT decreases, the gate voltage of n-type MOSFET device 70 decreases which results in a lower VGATE voltage on the source of n-type MOSFET device 70. As EA_OUT increases, VGATE also increases towards VIN. FIG. 3 provides a similar buffer 56 but uses a p-type MOSFET device 72. The buffers 56 of FIGS. 2 and 3 generally comprises source follower configurations.

Disadvantageously, the output voltage swings of buffers 56 of FIGS. 2 and 3 are limited because the n-type MOSFET device 70 of FIG. 2 cannot drive VGATE as high as VIN (due to the requirement that VGS must be greater than the threshold voltage of the transistor) and the p-type MOSFET device 72 of FIG. 3 cannot drive VGATE all the way down to ground for similar reasons. Further, the bias current source (IBIAS) needs to be relatively large to drive the PassFET 57 at the no-load condition in order achieve minimal propagation delay through the buffer. As a result, the quiescent current (IQ) of the buffers 56 of FIGS. 2 and 3 can be substantial during no-load conditions. Higher IQ, unfortunately, will drain the battery of a battery-operated device more quickly than for a lower IQ.

Figure 4:
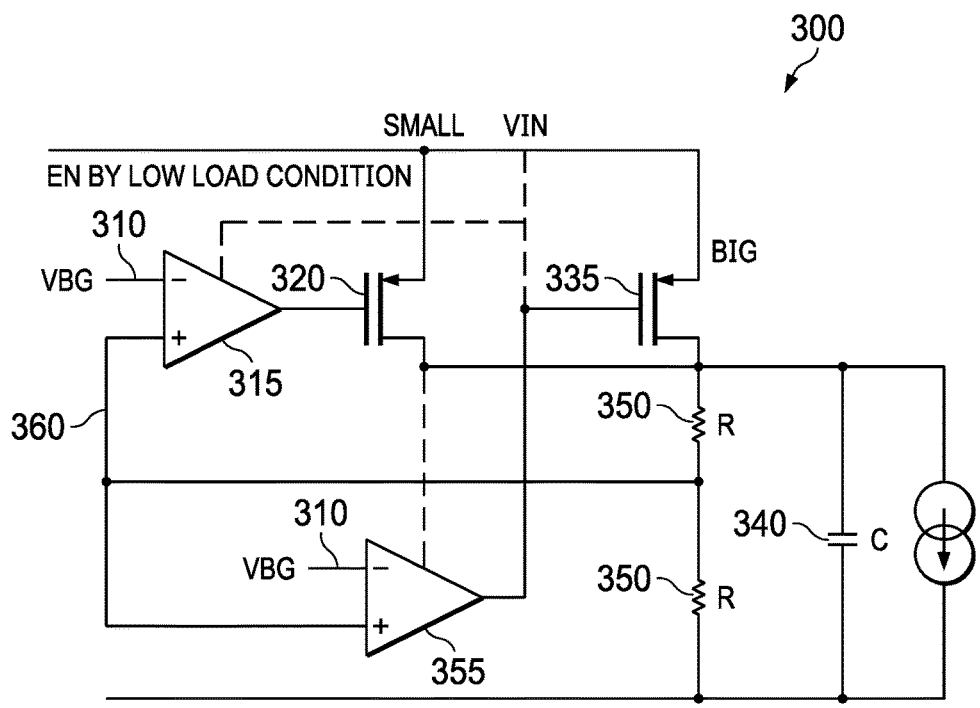
FIG. 4 illustrates a schematic of yet another buffer to drive the gate of the PassFET of the LDO regulator of FIG. 1.

FIG. 4 shows another example of an LDO regulator 300 in which the PassFET is implemented as two transistors 320 and 335. Transistor 335 is larger than the transistor 320 (that is, the width-to-length ratio of the channel of transistor 335 is larger than the width-to-length ratio of the channel of transistor 320). As such, all else being equal, more current will flow through transistor 335 than through transistor 330. The LDO regulator of FIG. 4 includes two independent control loops—one control loop to control the voltage on the gate of smaller transistor 320 and another control loop to control the voltage on the gate of larger transistor 335. One control loop includes error amplifier 315 which receives as its inputs a reference voltage VBG 310 and a feedback voltage 360 from a voltage divider comprising resistors 350. The output signal from error amplifier 315 is used to drive the gate of the smaller transistor 320. Current through the smaller transistor 320 flows to the load 340. The other control loop is similarly configured and includes error amplifier 355 which receives as its inputs VBG 310 and the feedback voltage 360. The output signal from error amplifier 355 is used to drive the gate of the larger transistor 335. Current through the larger transistor 335 flows to the load 340.

Each of the multiple control loops in the example of FIG. 4 is digitally enabled and disabled based on the output load current requirement. At low load current levels, the control loop for the smaller transistor 320 is enabled and the control loop for the larger transistor 335 is disabled. At larger load current levels, the operation is reversed and the control loop for the smaller transistor 320 is disabled and the control loop for the larger transistor 335 is enabled. Disadvantageously, the regulator of FIG. 4 has a different accuracy capability in different load current regions due to the presence of separate feedback control loops controlling the smaller and larger transistors 320, 335. Further, the regulator 300 of FIG. 4 is susceptible to large signal oscillations when switching between the smaller and larger control loops. Further still, the no load IQ in the dropout region of operation of the regulator can be very high due to the need to fully enhance the larger transistor 335. Additionally, two error amplifiers are used for the regulator 300 of FIG. 4 and thus the regulator occupies considerable area.

Figure 5:
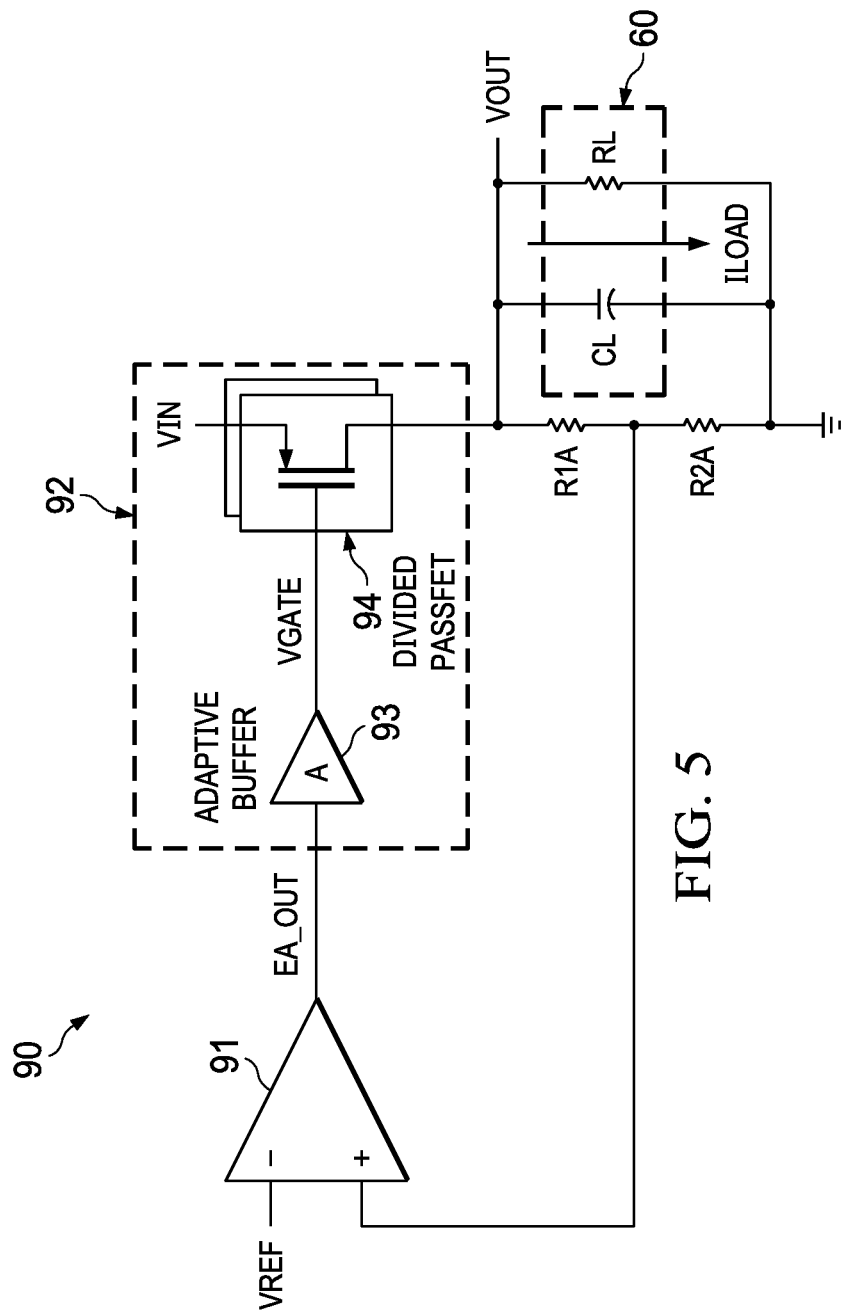
FIG. 5 is a schematic of an LDO regulator including an adaptive buffer for driving a divided PassFET.

FIG. 5 shows an example of an LDO regulator 90 including an error amplifier 91 and a power stage 92. A voltage divider comprising resistors R1A and R2A is included in this example to provide the feedback voltage Vfb to the positive input of the error amplifier 91. The power stage 92 in this example includes an adaptive buffer 93 and a divided PassFET 94. The divided PassFET 94 comprises multiple (two in this example), MOSFET devices. One MOSFET device is larger than the other. The adaptive buffer 93 drives the gates of the MOSFET devices in such a way that current through the smaller of the two MOSFET devices continuously flows throughout the range of load current (e.g., 0 to 1 A). The larger MOSFET device, however, is kept off at low load current levels and gradually turned as load current increases. As such, the current through the larger of the two MOSFET devices increases with increasing load current but only when the load current exceeds a threshold. Below that threshold, the current through the larger MOSFET device is zero.

Advantageously, only one error amplifier 91 is needed for LDO regulator 90 as opposed to two error amplifiers 315, 355 in the example of FIG. 4. As such, LDO regulator 90 is smaller than LDO regulator 300 of FIG. 4. Further, LDO regulator 90 implements continuous-time load current sharing between the two MOSFET devices. A single error amplifier 91 is used to control both MOSFET devices of the divided PassFET 94. No disturbances (e.g., oscillation) are present on the output voltage as load current is swept from zero to full load due to seamless load sharing between the MOSFET devices. The LDO regulator 90 of FIG. 5 is capable of relatively high accuracy across a wide range of load current and input voltage VIN. The near rail-to-rail output voltage swing helps in reducing the collective sizes of the power transistors MPL and MPS. The quiescent current (IQ) of the LDO regulator 90 is relatively low and is regulated across a wide range of input voltages (including the no-load condition). The propagation delay through the adaptive buffer 93 is relatively low as well which results in a relatively high bandwidth (e.g., 5 MHz at full load conditions). Consequently, the LDO regulator's operation is stable across a wide range of VIN (e.g., down to a VIN of 1 V) and load conditions.

Figure 6:
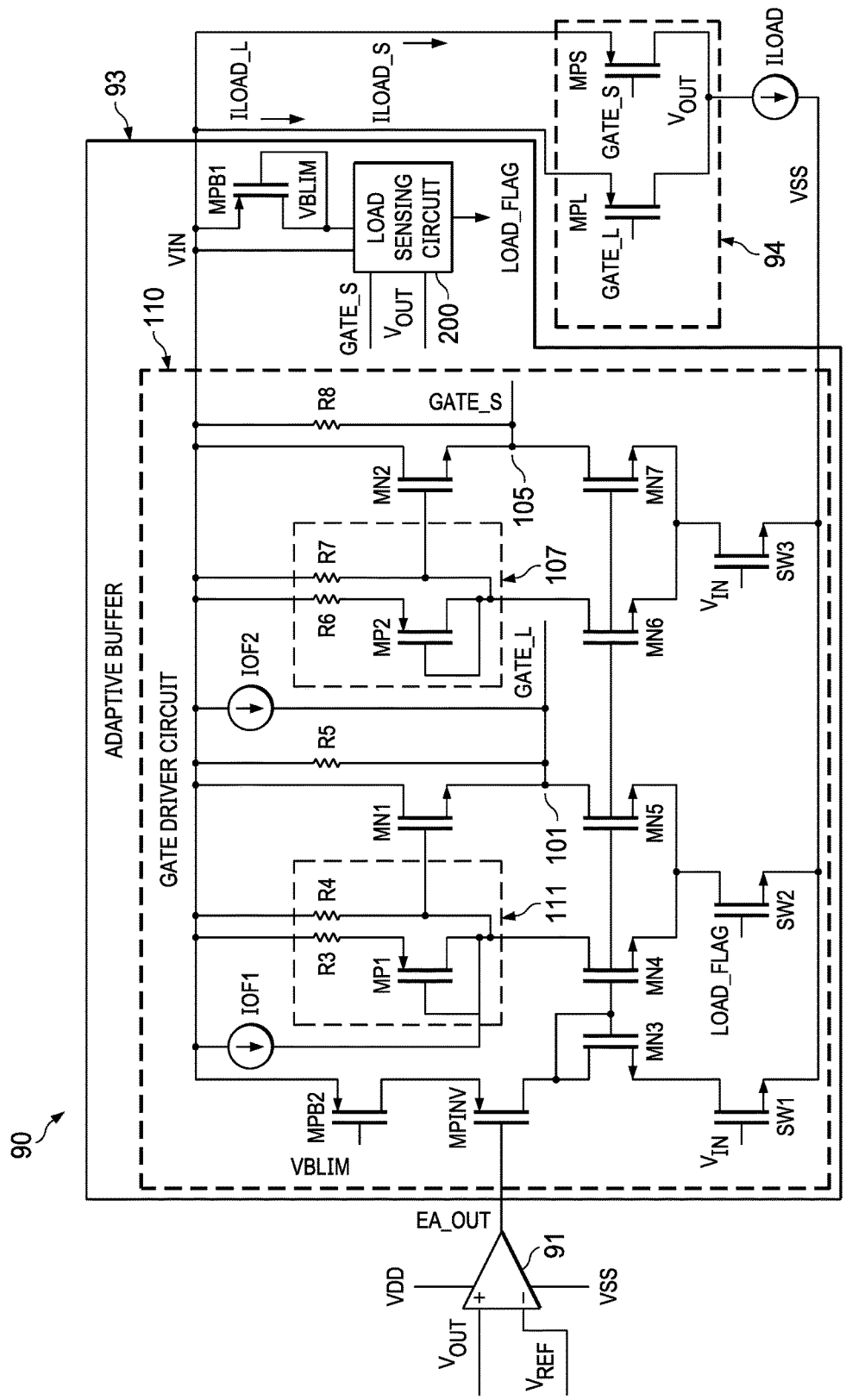
FIG. 6 is a more detailed schematic of the LDO regulator of FIG. 5.

FIG. 6 is a schematic illustrating an implementation of the LDO regulator 90 of FIG. 5. FIG. 6 shows the error amplifier 91, the adaptive buffer 93 and the divided PassFET 94. The divided PassFET 94 in this example includes a larger FET MPL and a smaller FET MPS. MPL and MPS comprise p-type MOSFET devices in this example. The signal on the gate of MPL is designated as GATE_L and the signal on the gate of MPS is designated as GATE_S. These gate signals are generated by the adaptive buffer 93. The current through the larger FET MPL is shown as ILOAD_L and the current through the smaller FET MPS is shown as ILOAD_S. The sum of ILOAD_L and ILOAD_S is the load current (ILOAD) to the load.

Each transistor mentioned herein includes a control input and a pair of current terminals. As a MOS device, the control input is the gate and the current terminals include the source and the drain. A bipolar junction transistor includes a control input that is the base and current terminals that include the emitter and collector.

The adaptive buffer 93 includes a gate driver circuit 110, a load sensing circuit 200 and a transistor MPB1. The gate driver circuit 110 includes transistors MPINV, MPB2, MP1, MN1, MP2, MN2, MN3, MN4, MN5, MN6, and MN7, switches SW1, SW2 and SW3, resistors R3, R4, R5, R6, R7, and R8, and current sources 10F1 and 10F2. The switches SW1, SW2 and SW3 comprises transistors that are operated as switches (i.e., on or off). The voltage on the gates of SW1 and SW3 is VIN, and thus SW1 and SW3 are on while VIN is available and above the threshold voltages of the switches. The on/off state of SW2, however, is controlled by a signal called LOAD_FLAG which is generated by the load sensing circuit 200 (discussed below).

In the example of FIG. 6, MPINV, MPB2, MP1, MP2, and MPB1 comprise p-type MOSFETs (pMOS devices), while MN1-MN7 comprise n-type MOSFETs (nMOS devices). The transistor types can differ in other implementations—nMOS devices substituted for pMOS devices, pMOS devices substituted for nMOS devices, bipolar junction transistors substituted for MOSFETs, etc.

The EA_OUT signal from the error amplifier 91 is coupled to and drives the gate of MPINV. In the example schematic of FIG. 6, the source of MPINV connects to the drain of MPB2, and the source of MPB2 is connected to the input voltage node (VIN). The drain of MPINV is connected to the gate of MN3 and MN4 as well as to the drain of MN3. The source of MN3 is coupled to the ground node (VSS) through switch SW1. MN4, MN5, MN6 and MN7 are connected in a mirroring configuration to mirror the current flowing through MN3. MN4, MN5, MN6 and MN7 can be sized in ratios of A:1, B:1, C:1 and D:1, respectively, with respect to MN3 and these ratios can be integer ratios or fractional ratios. Any two or more of the A:1 through D:1 ratios can be equal or different.

Referring still to FIG. 6, the source of MP1 is coupled to VIN through resistor R3. The drains of MP1 and MN4 are connected together. Current source IOF1 provides current from the VIN node to the node interconnecting the drains of MP1 and MN4. The gate of MP1 is connected to its drain. Resistor R4 connects between VIN and the drain of MP1 and the gate of MN1 as shown. The drain of MN1 is connected to VIN and its source is connected to the drain of MN5 at node 101. The sources of MN4 and MN5 are connected together and to SW2. When SW2 is off (i.e., not conducting current) which is the case when LOAD_FLAG is low, no current is permitted to flow MN1/MN5 or through MP1/MN4. Resistor R5 and current source IOF2 are connected in parallel between VIN and node 101. Both IOF1 and IOF2 can be implemented using pMOS-based current sources. The voltage on node 101 is the GATE_L signal to control the gate of the larger FET MPL. MP2, MN2, MN6, MN7, and resistors R7 and R8 are connected in a similar fashion and the voltage on node 105 (which interconnects the source of MN2 to the drain of MN7) provides the GATE_S signal to control the gate of the smaller FET MPS. The equivalent impedance of the components in dashed box 107 (MP2, R6, and R7) is designated as "Z." The equivalent impedance of the components in dashed box 111 (MP1, R3, and R4) is designated as "Z/n", where n is greater than 1.

Figure 9:
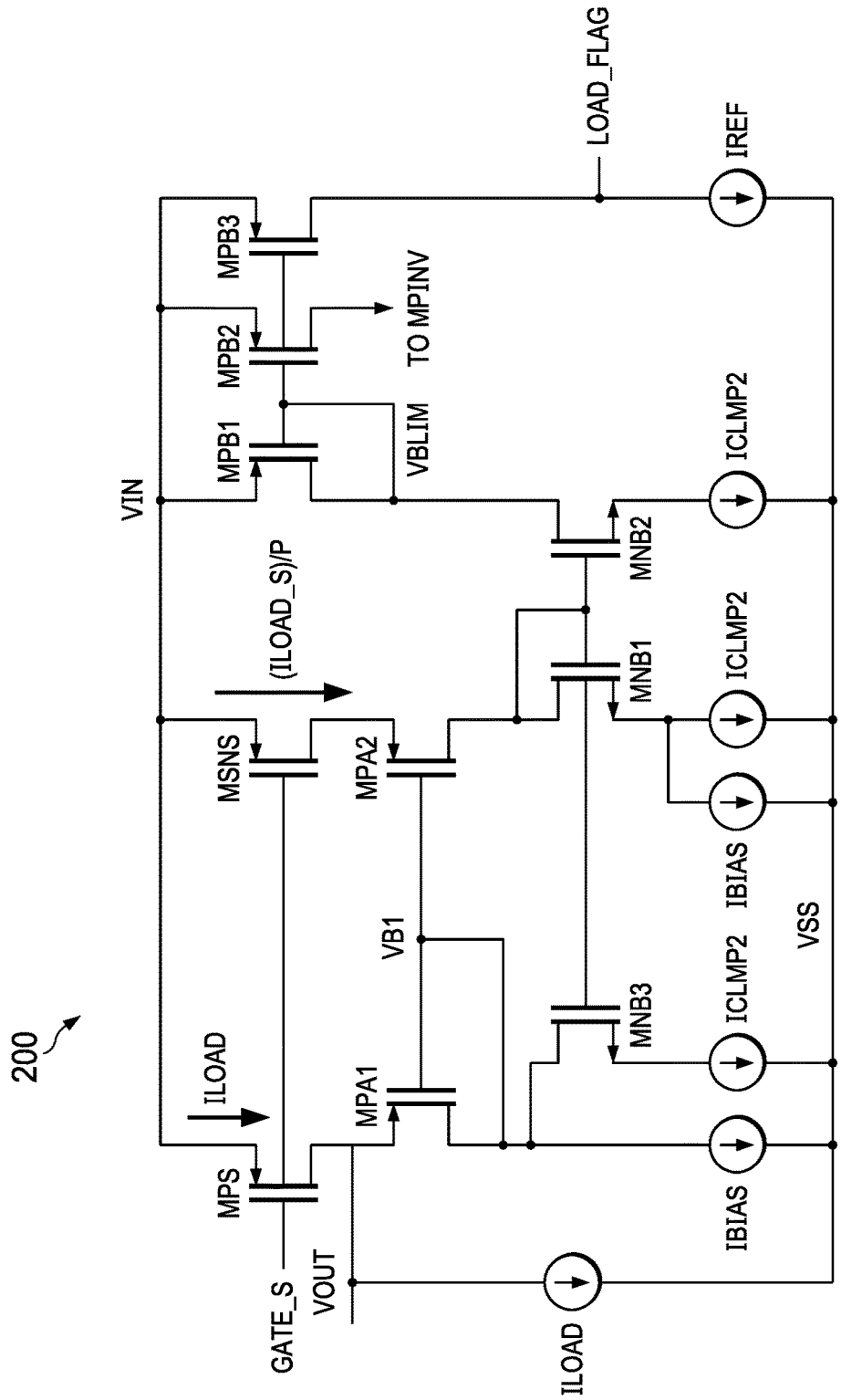
FIG. 9 is a schematic of a load sensing circuit used within the adaptive buffer of FIG. 5.

The load sensing circuit 200 receives GATE_S, VOUT and VIN as inputs and generates signals LOAD_FLAG and VBLIM as outputs. LOAD_FLAG is used to control the on/off state of SW2. VBLIM is an adaptive bias voltage that is based on load current ILOAD and is also based on the difference between VIN and VOUT. VBLIM Is used to control the gate of MPB2. LOAD_FLAG is a digital signal that is low when the load current (ILOAD) is less than a threshold (e.g., 2 milliamperes) and is high when the load current is greater than the threshold. FIG. 9 (discussed below) provides an example implementation of load sensing circuit 200. How VBLIM is generated and its use are described below.

During non-dropout operation of the LDO 90, VIN is greater than the dropout voltage above the specified regulated output voltage for the LDO. For example, if the LDO is a 3.3V regulator (i.e., it is intended to generate a regulated 3.3V output voltage) with a dropout voltage of 350 mV, the non-dropout operation is an input voltage that is greater than 350 mV above 3.3 V (i.e., greater than 3.65 V). During this mode of operation, the load current ILOAD can vary, depending on the load itself, from 0 amps (no-load condition) to a maximum rated load current for the LDO regulator 90.

Figure 7:
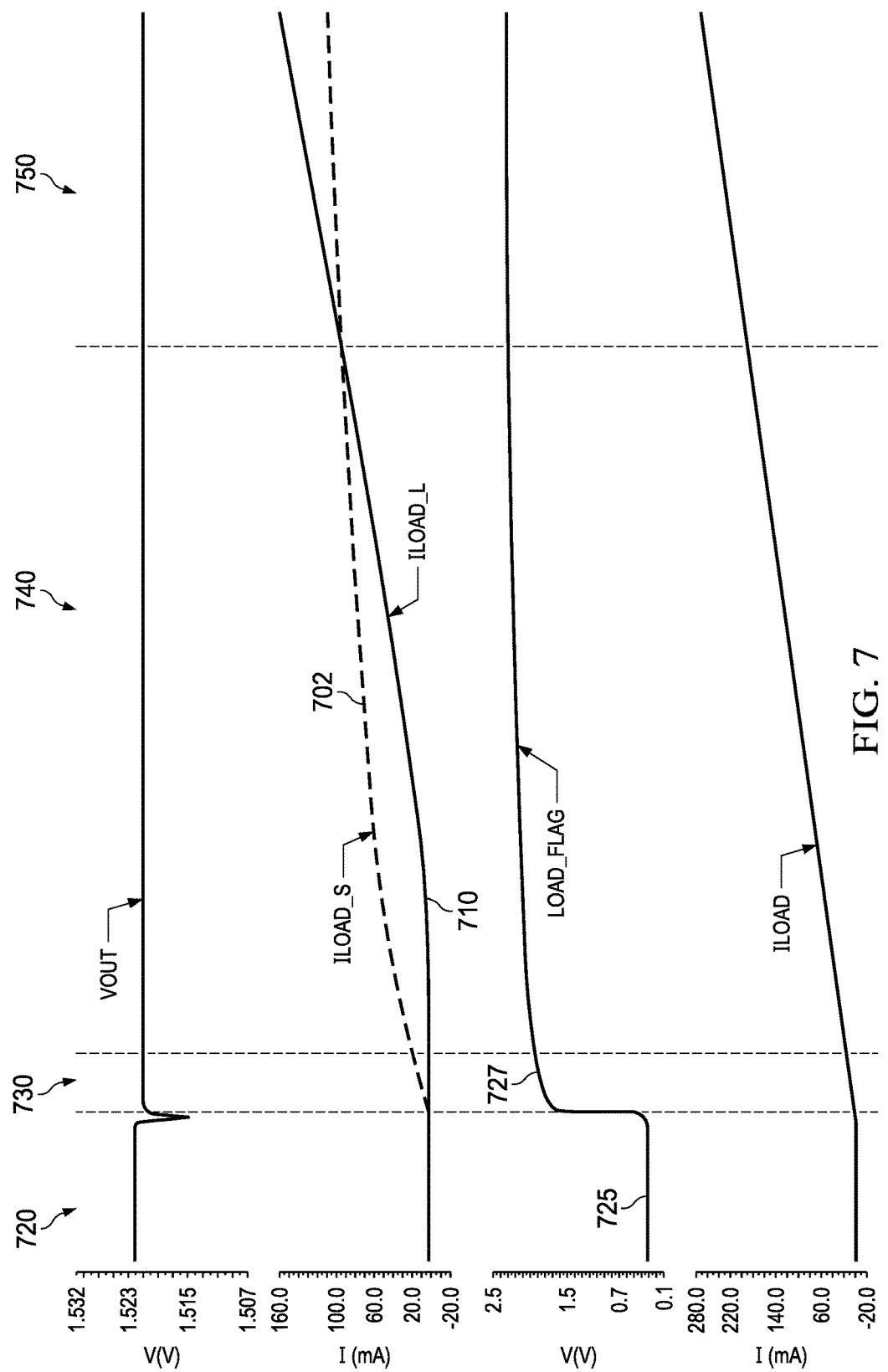
FIG. 7 includes signal waveforms illustrating the transient response of the LDO regulator of FIG. 6 as load current increases.

FIG. 7 includes waveforms of VOUT, ILOAD_S 702, ILOAD_L 710, LOAD_FLAG and ILOAD for four different regions 720, 730, 740, and 750. At 720, the load current is low (e.g., less than a threshold of, for example, 2 mA). As such, LOAD_FLAG is low as shown at 725. With LOAD_FLAG being low, SW2 is off and no current can flow through the branches MP1/MN4 and MN1/MN5. Consequently, GATE_L is pulled high to VIN via resistors R4 and R5 which act as weak pull-up devices. As GATE_L and the gate of MN1 are pulled high, IOF1 and IOF2 have zero overdrive voltage. With GATE_L high, MPL is off and thus the larger FET MPL does not provide any load current to the load (ILOAD=0). SW3, whose gate is biased by VIN, is on (and always on as long as VIN is above the threshold voltage of SW3). Current thus can flow through the branches defined by MP2/MN6 and MN2/MN7. The current through these branches is proportional to the current through MPINV (proportional based on the ratio of the size of MN3 to the sizes of MN6 and MN7). The current through MPINV is a function of the load current. Current through MP2 and MN2 is a mirrored copy of the current through MPINV and thus also is a function of the load current. The GATE_S voltage inversely varies with respect to the current through MP2 and MN2. For example, as current through MN2 increases, the GATE_S voltage decreases, and vice versa. As such, the smaller FET MPS is continuously controlled by GATE_S for different load currents.

In region 730 in FIG. 7, the load current has exceeded the threshold implemented by the load sensing circuit (e.g., 2 mA) and LOAD_FLAG is asserted high as shown at 727. Once LOAD_FLAG is asserted high, SW2 turns on to permit current to flow through the branches defined by MP1/MN4 and MN1/MN5. However, while the current through the MN4 and MN5 branches is smaller than IOF1 and IOF2, GATE_L remains high, and thus while the branches that drive the GATE_L signal are "enabled" in region 730 (branches MP1/MN4 and MN1/MN5), the GATE_L remains high and the larger FET MPL remains off and does not provide any load current.

Region 740 illustrates the operation when the load current exceeds a level at which the current through the MN4 and MN5 branches exceeds IOF1 and IOF2. At that point, current will flow through MN4 and MN5 thereby pulling the voltage of GATE_L downward. As such, current ILOAD_L begins to flow through the larger FET MPL and the ILOAD_L current adds with the ILOAD_S current to increase the load current ILOAD. The larger FET MPL thus begins to contribute to the load current demand of the load. The transition point from MPL not contributing any load current to MPL beginning to contribute load current is smooth and does not cause a discontinuity in the output voltage (VOUT) profile. As shown in region 740, current through both PassFET devices MPL and MPS increases with increasing load current. The ILOAD_L current 710, however, increases at a faster rate than ILOAD_S once MPL begins to conduct.

At some point, MPS saturates and ILOAD_S does not increase any more despite further increases in load current. This region of operation is shown at 750 during which ILOAD_L continues to increase but ILOAD_S does not increase (or increases only very minimally).

Figure 8:
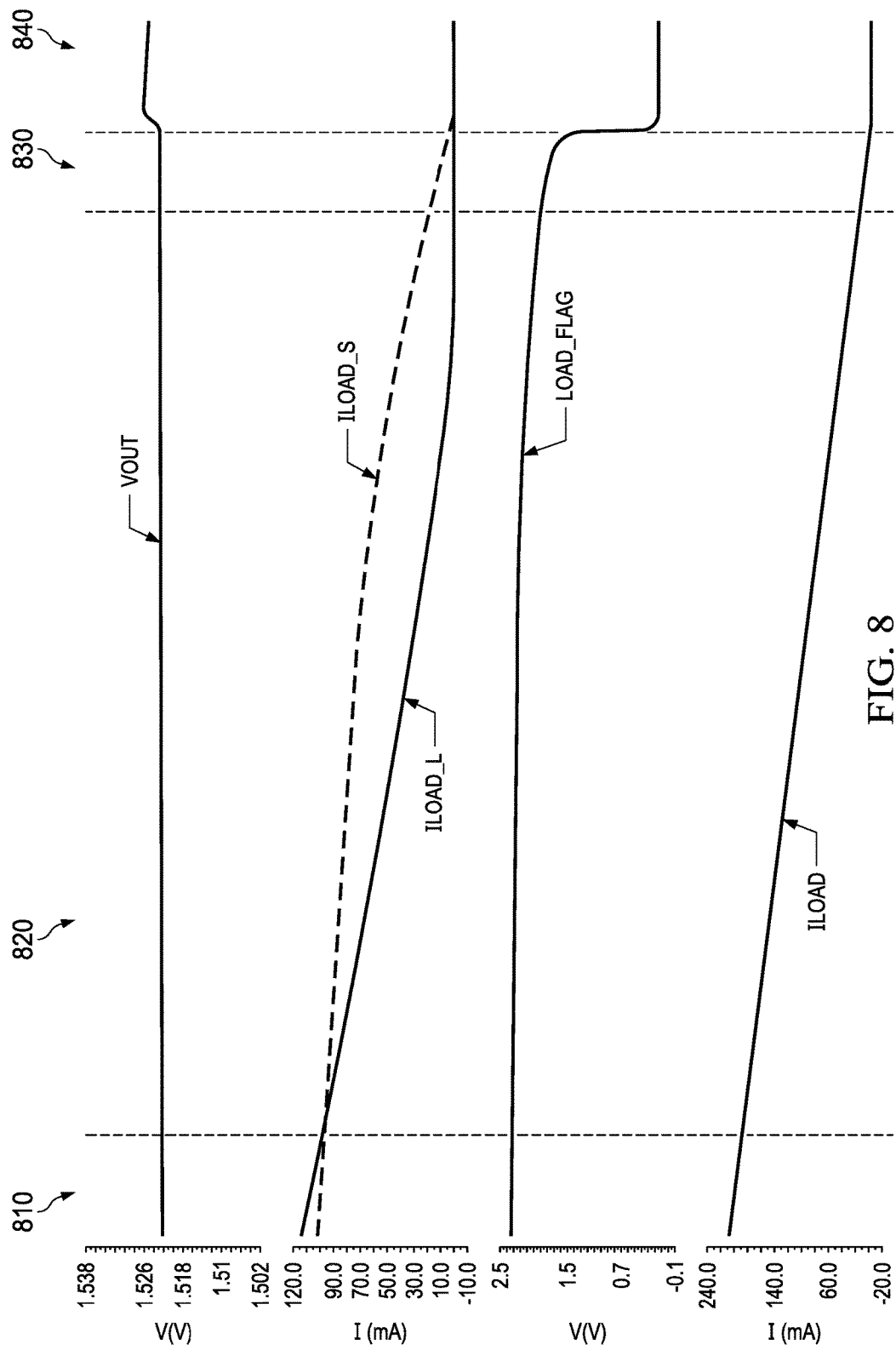
FIG. 8 includes waveforms for the same signals as load current decreases.

FIG. 8 provides waveforms for the same signals as in FIG. 7 but for a decreasing load current ILOAD. With the load current being relatively high, LOAD_FLAG is high and load current is supplied by both MPL and MPS as shown at 810, and MPS is in saturation. At 820, as ILOAD continues to decrease, ILOAD_L and ILOAD_S decreases as well. At 830, the load current remains high enough to keep LOAD_FLAG at a logic high level, but the current through the branches MN4 and MN5 is less than IOF1 and IOF2. As such, while SW2 remains on, no current flows through the MP1 and MN1 and GATE_L is forced high thereby turning of MPL. At 840, the load current has fallen below the threshold used to generate LOAD_FLAG and LOAD_FLAG becomes a logic low thereby turning of SW2.

Referring again to FIG. 6, during non-drop output operation, MPB2 operates in the deep linear region and represents a small resistance in the current path through MPINV. While in this mode of operation, MPINV operates in the saturation region. During drop-out operation (i.e., input voltage below the rated output voltage but high enough to permit VOUT to be regulated), the regions of operation of MPB2 and MPINV are reversed with MPB2 operating in the saturation region and MPINV operating in the linear region as MPINV's gate voltage is pulled to ground by the error amplifier 91. In drop-operation, MPB2 provides the control of the PassFET 94 instead of MPINV. The load sensing circuit 200 generates the adaptive bias voltage VBLIM. VBLIM is a voltage that is a function of the difference between VIN and VOUT as well as ILOAD. Based on the voltage VBLIM provided to its gate, MPB2 controls the current through MPB2/MPINV.

In dropout operation, as MPINV operates in the linear region, due to a large error signal from error amplifier, MPB2 regulates the current through the adaptive buffer. At low levels of ILOAD during dropout operation, VBLIM becomes close to the level of VIN and thus very little current flows through MPB2. In this manner, quiescent current is relatively small during light loading during dropout operation. As ILOAD increases during dropout operation, the load sensing circuit increases the level of VBLIM, which in turn causes MPB2 to increase its current flow.

FIG. 9 is a schematic showing a possible implementation of the load sensing circuit 200. The load sensing circuit 200 in this example includes transistors MSNS, MPA1, MPA2, MNB3, MNB1, MNB2, MPB1, and MPB3, and current sources IBIAS, ICLMP2 and IREF. MPS, MPB1 and MPB2 from FIG. 6 are also shown. The gate and source of MSNS are connected to the gate and source of MPS as shown. Thus, the source of MSNS is couple to the VIN node and the gate of MSNS is driven by the same signal, GATE_S, as MPS. MSNS is sized relative to MPS. In one example, the W/L ratio of MSNS is 1:P with respect to MPS. The drain of MPS carries the output voltage VOUT. The function of MSNS is to sense the current ILOAD_S through MPS. In order for that to happen, the gate-to-source voltages of MPS and MSNS must be the same and the drain-to-source voltages of MPS and MSNS also must be the same. MPA1 and MPA2 are used to make the drain voltage of MPS and the drain of MSNS equal to each other. The gates of MPA1 and MPA2 are connected to each other at node VB1. As the gate and drain of MPA1 are shorted together, the voltage on node VB1 will be equal to VOUT−VGS(MPA1) (where VGS(MPA1) refers to the gate-to-source voltage of MPA1). The voltage on the source of MP2 will be equal to VB1+VGS(MPA2) (where VGS(MPA2) is the gate-to-source voltage of MPA2). MPA1 and MPA2 are sized to be approximately equal and thus the voltage on the drain of MSNS will be approximately equal to VOUT.

Two current source devices IBIAS provide bias current through MPA1 and MPA2. At the no-load condition (no load current), the current that flows through MPA1 and MPA2 will be equal to IBIAS. As load current increases (ILOAD_S increases through MPS), current through MPS will also increase as the drain of MPS and MSNS are forced to be equal to each other with the help of MPA1 and MPA2. The current through MPS is (ILOAD_S)/P (where P is the size ratio between MPS and MSNS as noted above. Sensed current ((ILOAD_S)/P) also flows through MPA1 with the help of MNB3 to maintain equal gate-to-source voltages and drain-to-source voltages for MPA1 and MP2. The ICLMP2 current source devices clamps the sense current that flows through MSNS.

Sense current ((ILOAD_S)/P) also is mirrored between MNB1 and MNB2. As the load current ILOAD_S increases, the sense current (ILOAD_S)/P also increases and the sense current also flows through MPB1. MPB1 is a pMOS device whose gate and drain are shorted together. As MPB1 is a pMOS device in this example and its source is connected to the input voltage node VIN, the drain current through MPB1 will increase as its gate voltage decreases. The gate voltage on MPB1 thus is inversely related to load current. VBLIM is also related to the difference between VOUT and VIN as explained above.

The gates of MPB1, MPB2 and MBP3 are connected together as are their sources. The sizes of MPB1, MPB2 and MPB3 are the same in this example, thus the current I2 through MPB3 also equals the sense current through MSNS. The IREF current source causes IREF current to flow through MPB3 to the ground node. IREF can be set at any suitable reference value. In one example, IREF is set equal to 2 mA. LOAD_FLAG is the voltage on the drain of MPB3. When 12 is less the IREF, LOAD_FLAG is a low voltage. As I2 increases (and I2 increases as load current increases), eventually I2 begins to to exceed IREF. The drain current through MPB2 (which operates in the saturation region) is a function of the square of its gate-to-source voltage and its drain-to-source voltage. Its source voltage is fixed at VIN and its gate voltage is controlled by MPB1 as described above regarding the explanation of VBLIM. To keep 12 from exceeding IREF, the drain voltage of MPB3 increases. The drain voltage of MPB3 is LOAD_FLAG and thus as ILOAD_S exceeds IREF, LOAD_FLAG increases towards VIN. LOAD_FLAG thus provides an indication as to whether the load current is above or below a preset threshold.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A circuit, comprising:
   a first power transistor including a first control input;
   a second power transistor larger than the first power transistor, the second power transistor including a second control input;
   a first plurality of transistors coupled in series between an input voltage node and a ground node, the first plurality of transistors having a first node between two of the transistors of the first plurality of transistors, the first node coupled to the first control input;
   a second plurality of transistors coupled in series between the input voltage node and the ground node, the second plurality of transistors having a second node between two of the transistors of the second plurality of transistors, the second node coupled to the second control input; and
   a load sensing circuit coupled to the input voltage node, an output voltage node, and the first node, the load sensing circuit to generate a load flag signal indicative of a magnitude of a load current;

wherein the second plurality of transistors includes a transistor switch having a third control input coupled to receive the load flag signal.

2. The circuit of claim 1, further comprising a current source device coupled to the input voltage node and to the second node, the current source is configured to supply current into the second node.

3. The circuit of claim 1, wherein the first plurality of transistors includes a first transistor that has a fourth control input, the fourth control input coupled to the input voltage node.

4. The circuit of claim 1, further comprising a third transistor coupled in series with a fourth transistor between the input voltage node and the ground node, the third transistor including a third control input, the fourth transistor including a fourth control input, the third control input coupled to the load sensing circuit, and the fourth control input coupled to receive an output of an amplifier.

5. The circuit of claim 1, wherein the load sensing circuit includes:
   a third transistor coupled to the input voltage node;
   a current source device coupled to the third transistor at a third node; and
   when current flows through the current source device, the load flag signal comprises a voltage on the third node.

6. The circuit of claim 1, wherein the load sensing circuit includes:
   a third transistor having a fourth control input and first and second current terminals, the first current terminal coupled to the input voltage node, and the fourth control input coupled to the second current terminal;
   a fourth transistor having a fifth control input and third and fourth current terminals, the third current terminal coupled to the second current terminal at a third node; and
   a second current source device coupled to the fourth current terminal.

7. The circuit of claim 6, further comprising:
   a fifth transistor including a sixth control input and fifth and sixth current terminals, the fifth current terminal coupled to the input voltage node, and the sixth control input coupled to the third node; and
   a fourth transistor including a seventh control input and seventh and eighth current terminals, the seventh current terminal coupled to the sixth current terminal.

8. The circuit of claim 7, wherein the seventh node is coupled to receive an output of an amplifier.

9. The circuit of claim 1, further comprising a second current source coupled to the input voltage node and the first node.

10. A circuit, comprising:
    a first power transistor including a first control input and first and second current terminals;
    a second power transistor including a second control input and third and fourth current terminals, the third current terminal coupled to the first current terminal, and the fourth current terminal coupled to the second current terminal at an output node;
    an error amplifier configured to generate an error signal based on a difference between a reference voltage and an output voltage on the output node; and
    an adaptive buffer coupled to an output of the error amplifier and coupled to the first and second control inputs, the adaptive buffer configured to cause the first power transistor to be on through a range of output current and to cause the second power transistor to be on through some, but not all, of the range of output current.

11. The circuit of claim 10, wherein the adaptive buffer comprises:
    a first plurality of transistors coupled in series between an input voltage node and a ground node, the first plurality of transistors having a first node between two of the transistors of the first plurality of transistors, the first node coupled to the first control input; and
    a second plurality of transistors coupled in series between the input voltage node and the ground node, the second plurality of transistors having a second node between two of the transistors of the second plurality of transistors, the second node coupled to the second control input.

12. The circuit of claim 10, wherein the first plurality of transistors includes a third transistor that has a control input coupled to the input voltage node.

13. The circuit of claim 10, further comprising a load sensing circuit coupled to the input voltage node, an output voltage node, and the first node, the load sensing circuit to generate a load flag signal indicative of a magnitude of a load current.

14. The circuit of claim 13, wherein the second plurality of transistors includes a transistor switch having a third control input coupled to receive the load flag signal.

15. The circuit of claim 10, wherein the second power transistor is larger than the first power transistor.

16. A circuit, comprising:
    a first power transistor including a first control input;
    a second power transistor including a second control input;
    a first plurality of transistors coupled in series between an input voltage node and a ground node, the first plurality of transistors configured to conduct a first current based on a load current, the first plurality of transistors having a first node between two of the transistors of the first plurality of transistors, the first node coupled to the first control input, and the first plurality of transistors including a third transistor having a control input coupled to the input voltage node;
    a load sensing circuit coupled to the input voltage node, an output voltage node, and the first node, the load sensing circuit to generate a load flag signal indicative of a magnitude of a load current; and
    a second plurality of transistors coupled in series between the input voltage node and the ground node, the second plurality of transistors configured to conduct a second current based on the load current, the second plurality of transistors having a second node between two of the transistors of the second plurality of transistors, the second node coupled to the second control input, and the second plurality of transistors including a transistor switch having a control input coupled to receive the load flag signal.

17. The circuit of claim 16, wherein the second power transistor is larger than the first power transistor.

18. The circuit of claim 16, further comprising:
    a first current source device configured to provide current into the first node; and
    a second current source device configured to provide current into the second node.

19. The circuit of claim 16, wherein the load sensing circuit includes:
    a fourth transistor coupled to the input voltage node;
    a current source device coupled to the third transistor at a third node; and
    when current flows through the second current source device, the load flag signal is a voltage on the third node.

20. The circuit of claim 19, further comprising a fifth transistor coupled in series with a sixth transistor between the input voltage node and the ground node, the fifth transistor including a third control input, the sixth transistor including a fourth control input, the third control input coupled to the load sensing circuit, and the fourth control input coupled to receive an output of an amplifier.

\* \* \* \* \*